United States Patent
Miller et al.

(10) Patent No.: US 7,145,488 B2
(45) Date of Patent: *Dec. 5, 2006

(54) METHOD AND SYSTEM FOR CONVERTING DIGITAL SAMPLES TO AN ANALOG SIGNAL

(75) Inventors: Kevin L. Miller, Lawrenceville, GA (US); Keith L. Klingler, San Diego, CA (US); Brian F. Schoner, Fremont, CA (US)

(73) Assignee: Broadcom Corporation, Irvine, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 11/342,658

(22) Filed: Jan. 31, 2006

(65) Prior Publication Data

US 2006/0119497 A1 Jun. 8, 2006

Related U.S. Application Data

(63) Continuation of application No. 10/791,534, filed on Mar. 3, 2004, now Pat. No. 6,992,604.

(60) Provisional application No. 60/505,022, filed on Sep. 24, 2003.

(51) Int. Cl.
*H03M 1/00* (2006.01)

(52) U.S. Cl. .......................... 341/110; 341/61
(58) Field of Classification Search ................ 341/144, 341/61, 110
See application file for complete search history.

(56) References Cited

U.S. PATENT DOCUMENTS

| | | | |
|---|---|---|---|
| 3,864,311 A | 2/1975 | Jahnke | |
| 5,512,895 A | 4/1996 | Madden et al. | |
| 5,640,161 A | 6/1997 | Johnson et al. | |
| 5,872,531 A | 2/1999 | Johnson et al. | |
| 6,208,671 B1 | 3/2001 | Paulos et al. | |
| 6,215,415 B1 | 4/2001 | Schroder | |
| 6,215,423 B1 | 4/2001 | May et al. | |
| 6,373,417 B1 * | 4/2002 | Melanson | 341/144 |
| 6,642,876 B1 * | 11/2003 | Subramoniam et al. | 341/144 |

* cited by examiner

*Primary Examiner*—Lam T. Mai
(74) *Attorney, Agent, or Firm*—Sterne, Kessler, Goldstein & Fox PLLC

(57) ABSTRACT

Provided is a system and method for converting digital data audio data audio data that has a predetermined input sample rate, into an analog data signal. A system includes a digital to analog converter (DAC) including a digital processing portion configured to receive as an input the digital audio data and timing information, the timing information being representative of a time base of the input sample rate. The digital processing portion is similarly configured to digitally process the digital audio data and the timing information to produce serialized output data. The DAC also includes an analog processing portion configured to convert serialized data to an analog format. The digital processing portion operates in accordance with at least one clock having a corresponding clock rate wherein the corresponding clock rate is unrelated to the input sample rate.

10 Claims, 13 Drawing Sheets

METHOD AND SYSTEM FOR CONVERTING DIGITAL SAMPLES TO AN ANALOG SIGNAL

CROSS-REFERENCE TO RELATED APPLICATIONS

This application is a Continuation of U.S. application Ser. No. 10/791,534, filed Mar. 3, 2004 is now a U.S. Pat. No. 6,992,604, and claims the benefit of U.S. Provisional Application No. 60/505,022, filed Sep. 24, 2003, entitled "Method and System for Converting Digital Samples to an Analog Signal," all of which is incorporated by reference herein in its entirety.

BACKGROUND OF THE INVENTION

1. Field of the Invention

The present invention relates generally to the conversion of digital data to analog data. More specifically, the present invention relates to the use of digital to analog converters (DACs) to convert digital data to analog signals in recovery systems such as set top cable boxes.

2. Related Art

Currently available set top cable boxes generally include one or more DACs. Each DAC typically includes several clocks to provide timing to various components within the DAC. More particularly, these clocks ensure that the output of audio and/or video data samples is output from the DAC at the same sample rate that data is input to the DAC. For example, the currently available set top cable boxes may include formats based upon moving picture experts group (MPEG) data transport. To ensure proper operation of these MPEG conforming set top cable boxes, resolving timing issues, such as the correlation between input and output sample rates, becomes absolutely critical. Matching input and output sample rates in DACs are desirable in order to prevent overflow or underflow of data within the DAC.

Resolving timing issues is much more difficult in more complex set top cable boxes. Complex set top cable boxes may decode several data streams simultaneously, requiring several different system clocks. For example, one set top box might support two televisions, with each television supporting different programming. Additionally, it is contemplated that each television may be able to support features such as picture-in-picture, such that each television can display two different programs simultaneously. In these examples, each separate data stream associated with each of the separate features will require its own local clock. More specifically, to ensure proper synchronization, each of these local clocks must operate at a clock rate directly related to the input sample rate of its associated data stream. Thus, a single DAC capable of accommodating multiple data streams and multiple set top box features, will require several system clocks.

As set top cable boxes and other audio/video systems that use DACs become even more complicated, miniaturizing DACs and other critical system components becomes a significant design challenge. Thus, from this perspective, a single DAC that requires multiple clocks can impose significant limitations and demands on DAC chip designs with miniaturization requirements.

What is needed therefore is a mechanism to reduce the number of clocks required for a single DAC to accommodate multiple data streams. The multiple data streams are created as a function of complex audio/video programming features that operate at different input sample rates. More specifically, what is needed is a method and system to enable a DAC to use a single clock capable of operating independent of the input sample rate.

SUMMARY OF THE INVENTION

Consistent with the principles of the present invention as embodied and broadly described herein, the present invention includes a DAC configured to convert input digital audio data that has a predetermined input sample rate, into an analog data signal. The DAC includes a digital processing portion configured to receive as an input the digital audio data and timing information. The timing information is representative of a time base of the input sample rate. The digital processing portion is also configured to digitally process the digital audio data and the timing information to produce serialized output data. The DAC also includes an analog processing portion configured to convert serialized data to an analog format. The digital processing portion operates in accordance with at least one clock having a corresponding clock rate wherein the corresponding clock rate is unrelated to the input sample rate.

In the present invention, a DAC is provided that includes a system clock that is capable of running, for example, off of a fixed clock or a free running oscillator. That is, the system clock is unrelated to the input sample rate. In one exemplary embodiment of the present invention, the DAC is capable of receiving linearly encoded digital data having a sample rate between 10 and 100 KHz and converting to serial digital signals having a 27 MHz bit rate. The ratio between the two rates need not be a fixed ratio. One feature of this process is that up-sampling performed within the DAC is preferably formed in stages. For example an incoming audio signal at a sample rate at 48 KHz, is up-converted to 843.75 KHz, then to 3.375 MHz, and finally to 27 MHz. The 27 MHz signals are then fed to an off-chip differential analog filter. In other embodiments, the differential analog filter can be an on-chip implementation.

In the present invention, the independence of the system clock and the input sample rate facilitates the formation of the digital processing portion of the DAC on a single integrated circuit (IC) circuit chip. A significant savings in IC chip space can be realized by performing up-conversion in multiple stages. Savings are also realized by eliminating the requirement that the system clock be related to the input sample rate. Additionally, in the present invention all of the processing within the digital processing portion remains in the digital domain all the way off-chip. In other words, there is no longer a requirement to include analog circuitry on the IC chip.

In this manner, analog circuitry can be kept quieter by isolating it from the digital circuitry. Additionally, the removal of the analog circuitry from the chip contributes to a reduction in the overall chip size. Thus, integration of the DAC into larger digital systems such as set top cable boxes becomes simpler and less costly.

Further features and advantages of the present invention as well as the structure and operation of various embodiments of the present invention, are described in detail below with reference to the accompanying drawings.

BRIEF DESCRIPTION OF THE DRAWINGS/FIGURES

The accompanying drawings, which are incorporated in and constitute part of the specification, illustrate embodiments of the present invention and, together with the general description given above and the detailed description of the embodiments given below, serve to explain the principles of the invention. In the drawings.

DETAILED DESCRIPTION OF THE INVENTION

Figure 1:
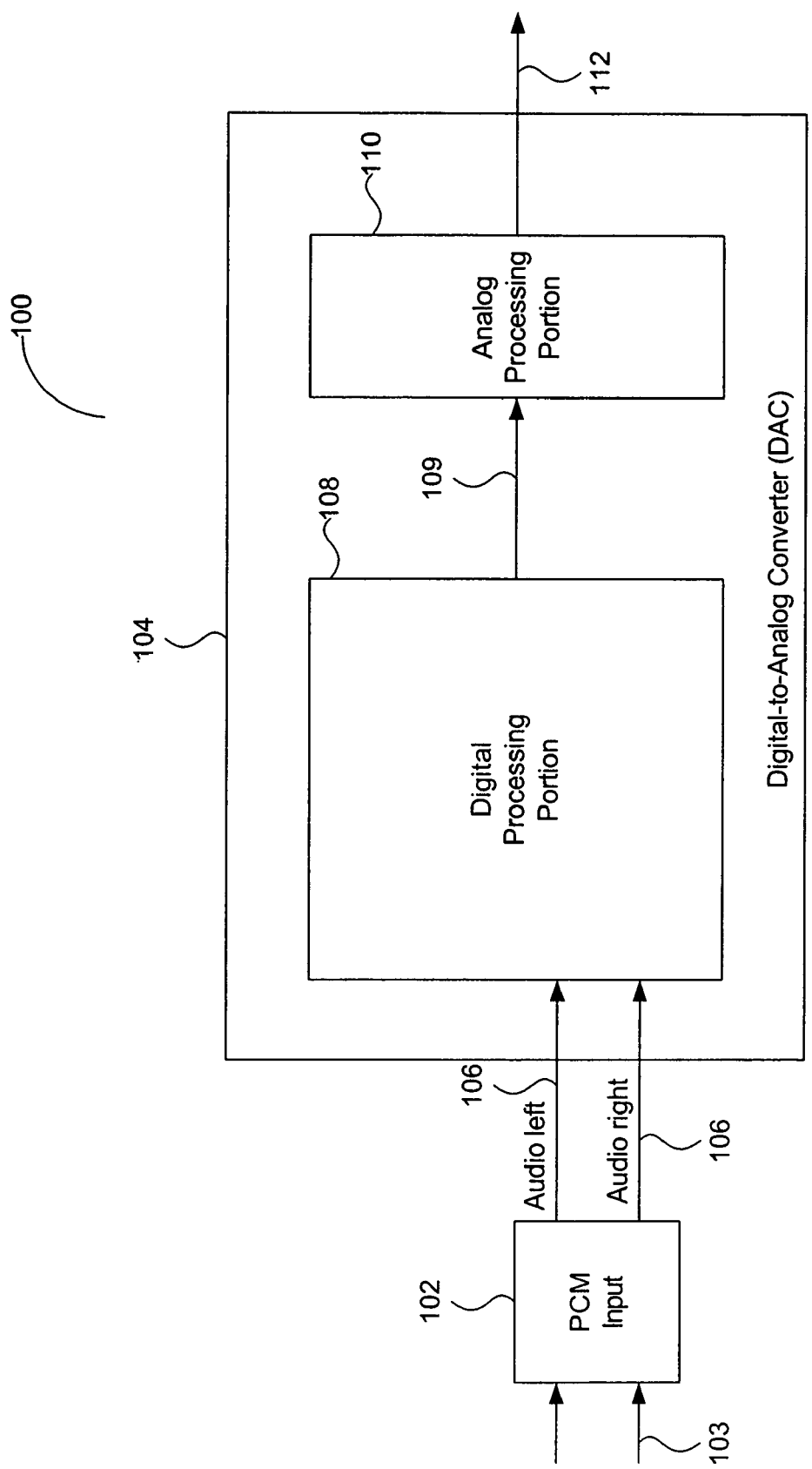
FIG. 1 is a block diagram illustration of a DAC structured in accordance with an embodiment of the present invention.

The following detailed description of the present invention refers to the accompanying drawings that illustrate exemplary embodiments consistent with this invention. Other embodiments are possible, and modifications may be made to the embodiments within the spirit and scope of the invention. Therefore, the following detailed description is not meant to limit the invention. Rather, the scope of the invention is defined by the appended claims.

It would be apparent to one skilled in the art that the present invention, as described below, may be implemented in many different embodiments of hardware, software, firmware, and/or the entities illustrated in the drawings. Any actual software code with the specialized controlled hardware to implement the present invention is not limiting of the present invention. Thus, the operation and behavior of the present invention will be described with the understanding that modifications and variations of the embodiments are possible, given the level of detail presented herein.

FIG. 1 is a block diagram illustration of an audio/video system 100 constructed in accordance with an embodiment of the present invention. The audio video system 100 includes a PCM input module 102 configured for receiving compressed audio data samples 103, and a DAC 104. The DAC 104 is configured to receive left and right audio data 106 from the PCM input module 102. The DAC 104 includes a digital processing portion 108 that receives the left and right audio data 106 and produces a serialized output 109. The serialized output 109 is then provided to an analog processing portion 110, where the serialized output data 109 is converted to analog data and provided as an analog output 112.

Figure 2:
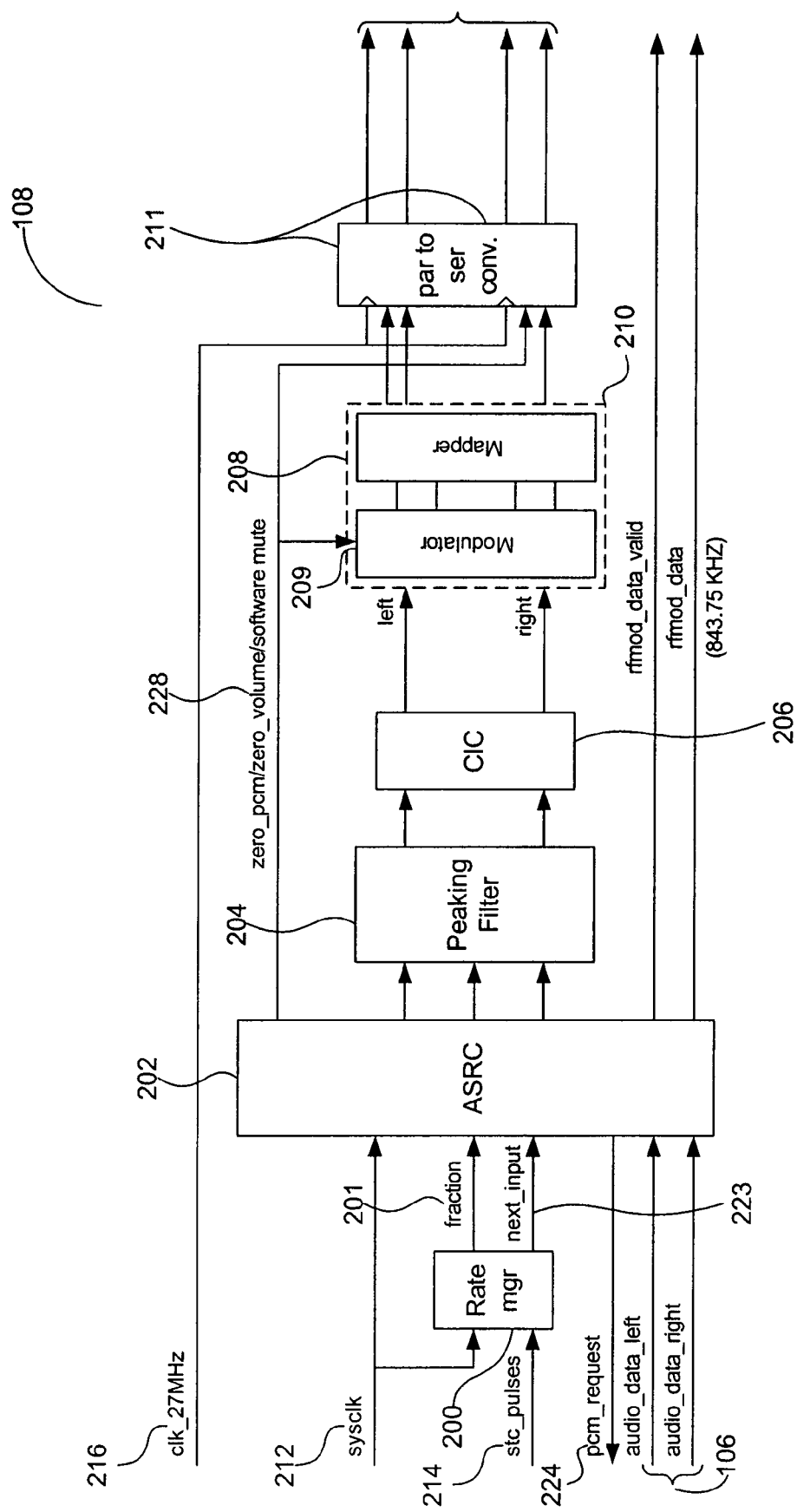
FIG. 2 is a block diagram illustration of a digital processing portion associated with the DAC in FIG. 1.

FIG. 2 is a more detailed block diagram illustration of the digital processing portion 108 shown in FIG. 1. In the present invention, processing techniques within the digital portion 108, discussed in additional detail below, enable it be formed on a single IC. The digital processing portion 108 includes a rate manager 200 and an ASRC 202. The rate manager 200 is configured to lock an audio input sample rate to a system time reference. As a step in this process, the rate manager 200 sends a fractional value 201 to indicate relative timing between input data samples and system time. The fractional value 201 also informs the ASRC 202 when a new input sample is available. Other exemplary components included in the digital processing portion 108 include a peaking filter 204, and a CIC filter 206. Also included is a digital modulator mapper 208 that includes a digital modulator 209 and a mapper 210. An output of the mapper 210 is provides to a parallel to serial converter 211.

As shown in FIG. 2, the rate manager 200 and the ASRC 202 both operate off of a fixed system clock 212. A separate "clean" clock signal 216 is used by another portion of the digital portion 108, discussed more fully below.

The ASRC 202 receives, as an input, the left and right audio data 106 output from the PCM input module 102, shown in FIG. 1. Although the audio data 106 can be provided at any suitable input sample rate, for purposes of illustration herein, the audio data samples 106 are provided at input sample rates of 48 KHz, 44.1 KHz, or 32 KHz.

It's generally desirable to have a substantial match between the input and output sample rates of any DAC. Before reception by the PCM input module 102, the audio data samples 106 could have originated, for example, within an MPEG broadcasting station. The audio data 106 can be representative of different audio channels of a satellite television (TV) transmission to a customer's set top box. In this example, the audio data 106 is transmitted at a fixed data rate, such as the 48 KHz rate discussed above, and would be broadcast to all other users at this same fixed data rate.

In the above example of an MPEG transmission, all data formatting, such as the establishment of sample rates, occurs in an upstream MPEG head-end (not shown). A receiving end DAC, such as the DAC 104, must then be configured to match the incoming sample rate of incoming data, such as the audio data 106. A standard technique used to achieve this sample rate match is that the up-stream MPEG head-end will typically time-stamp the audio data stream. That is, the MPEG head-end will encode time references within audio data streams, such as the audio data stream 106, to more precisely convey the sample rate to the receiving DAC. Such a time reference can be used to determine whether the input audio data 106 is being transmitted at the 48 KHz, 44.1 KHz, or 32 KHz rate.

More specifically, the MPEG head-end will encode the audio data samples 106 with program clock references (PCRs), as a time reference for the transmission sample rate. At the same time, separate MPEG system time code (STC) pulses will be sent along a separate data path as an indication of the true time base of the sample rate of the audio data samples 106. Thus, in the exemplary embodiment of FIG. 2, STC pulses 214 are received as an input to the rate manager 200 to precisely convey the time base associated with the sample rate of the audio data 106. The format, structure, and other specifics associated with MPEG transmissions, such as time stamping and the STC pulses 214, are well known in the art.

As noted above, a significant limitation of conventional DACs is the requirement to have a separate clock to accommodate each separate input sample rate value received within the DAC. In these conventional DACs, STC pulses enable each of these separate and independent clocks to lock on to the corresponding separate and independent input sample rate. This process is a classic technique used in the art to help system clocks run a little faster or a little slower in association with the input sample rate of their corresponding input samples. Ultimately, this process assists the system clocks in matching the clock of the input samples at the MPEG head-end.

However, as the complexity of DAC based audio and video systems increases, these traditional techniques become less practical. For example, system clocks typically include components such as voltage controlled crystal oscillators (VCXO). The higher the number of separate input sample rates a given DAC is required to handle, the greater the number of VCXOs that will be required on the chip, greatly increasing the chip's cost. Secondly, synchronizing the timing between multiple VCXOs and multiple data streams, each having their own input sample rate, is more difficult to achieve technically.

The present invention, however, eliminates the need of multiple system clocks to accommodate multiple input sample rates. In the present invention, a sample rate conversion technique is used instead of having separate system clocks, each running at a different sample rate. In the present invention, a single free running clock, such as a crystal oscillator, can be used. More importantly, this single free running clock can run at a clock rate unrelated to any input sample rate. In other words, a DAC constructed in accordance with an embodiment of the present invention can receive input samples at any input sample rate, and at the same time, have the entire chip running off of a single fixed system clock.

In the present invention, the rate manager 200 receives the STC pulses 214 as a mechanism to determine the time base associated with the input audio data 106. The STC pulses 214 provide a reliable assessment of how fast or slow the input audio data samples 106 are running relative to the fixed system clock 212. Although any clock rate can be used, in the exemplary embodiment of FIG. 2, the system clock 212 operates at a clock rate of 108 MHz, a multiple of 27 MHz. As a practical matter, the system clock 212 provides operational timing for all components within the digital portion 108, except for the parallel to serial converters 211. The operation of the digital portion 108 will now be described in greater detail.

In the exemplary embodiment of FIG. 2, the left and right audio data 106 is received by the ASRC 202 at a sample rate of 48 KHz, 44.1 KHz, or 32 KHz. The audio data 106 is initially generated by the up-stream MPEG head-end, that in turn also provides the STC pulses 214 as an indication of the true time base associated with the audio data 106.

In the example of FIG. 2, the 48/44.1/32 KHz audio data 106 is based upon a time base of about 27 MHz. Although in the example of FIG. 2 the time base of the STC pulses 214 is the same as the time base of the system clock 212 (also 27 MHz), this need not be the case. The STC pulses 214 do not include any significant drift and, therefore, provide an excellent timing mechanism by which the rate manager 200 can produce the fractional value 201 and a next input value 223. Next, the STC pulses 214 are received by the rate manager 200 at a rate of one STC pulse precisely every 562.5 clock cycles (27 MHz/48 KHz=562.5 clocks).

Figure 3:
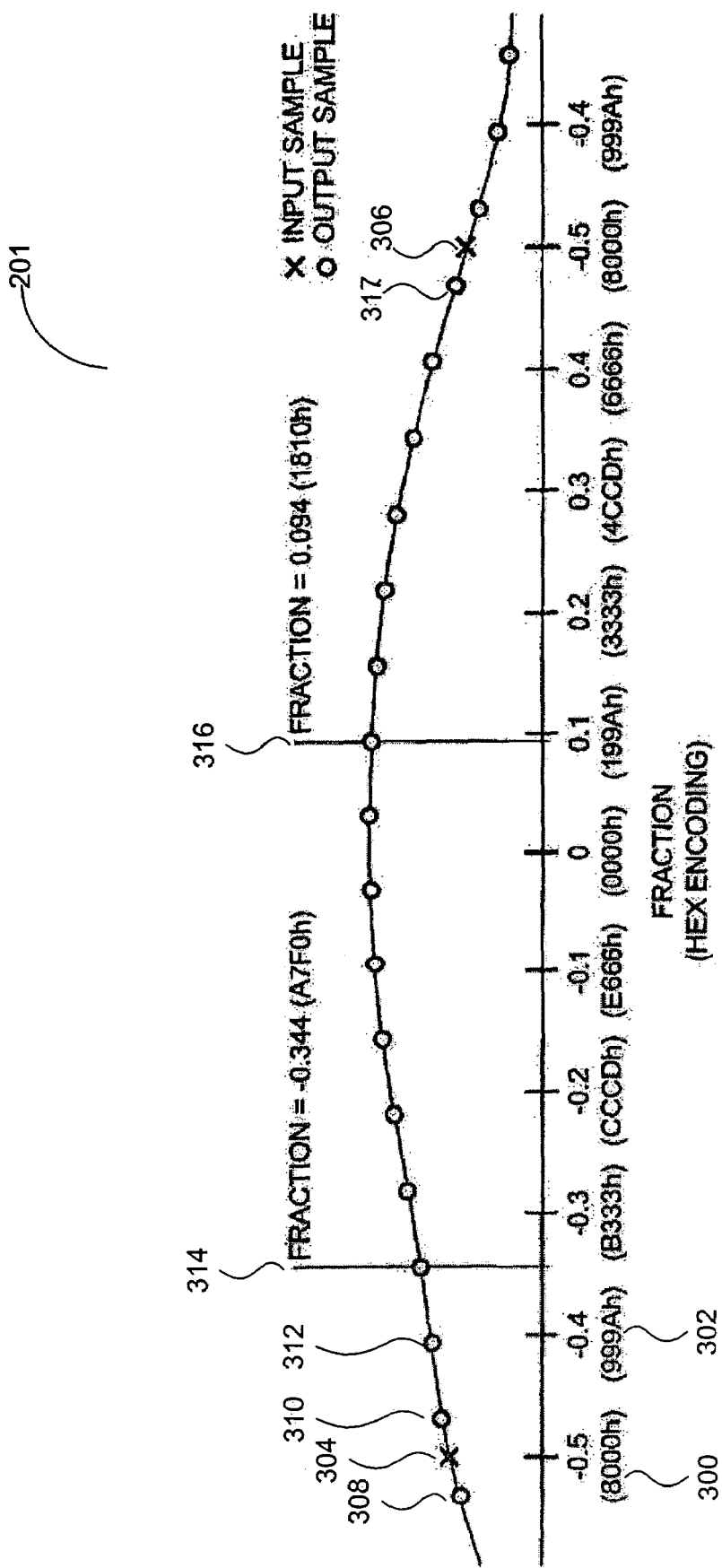
FIG. 3 is a graphical illustration of a fractional value used in the embodiment shown in FIG. 1.

FIG. 3 provides a graphical illustration of a series of fractional values 201 produced by the rate manager 200. The series of fractional values 201 conveys to the ASRC 202 an indication of output sample rates in relation to the input sample rate. In this regard, the rate manager 200 operates as a type of digital phase lock loop (PLL), serving to lock the audio sample rate to a system time reference. Additional details of the rate manager 200 are provided in U.S. patent application Ser. No. 10/462,955 filed Jun. 17, 2003, entitled "Data Rate Management System and Method for A/V Decoder," and in U.S. patent application Ser. No. 10/313,237 filed Dec. 5, 2002, entitled "NCO Based Time Base Recovery System and Method for A/V Decoder," the complete subject matter of which are incorporated herein by reference in their entirety.

In the example of FIG. 2, the rate manager 200 provides the fractional value 201 to the ASRC 202 every clock cycle of the system clock 212. The ASRC 202 then asynchronously up-converts the audio data 106 (48 KHz sample rate) to an exemplary intermediate sample rate of 843.75 Hz. Since the ASRC 202 outputs at the intermediate sample rate of 843.75 KHz, the ASRC 202 will use only one phase value of the fractional value 201 every 843.75 KHz. The rate manager 200 will also provide a strobe indicating that the phase has rolled over and that it is time for the ASRC 202 to input a new input data sample.

In FIG. 3, for example, every clock cycle of the 108 MHz system clock 212 (i.e., every 9.259 nanoseconds) the rate manager 200 provides a particular fractional value 201, such as the values 300 and 302 shown in FIG. 3. The "Xs" 304 and 306 are representative of input samples to the ASRC 202 at a rate corresponding to the STC pulses 214. Therefore, the input samples 304 and 306 are separated by the 562.5 cycles of the 27 MHz time base associated with the STC pulses 214. Note: In the examples above, the 562.5 clock cycles are associated with 48-khz audio. Also in FIG. 3, output samples (Os), such as the values 308, 310, 312, 314 and 316, are generated by the ASRC 202.

Each time the ASRC 202 needs to output a new 843.75 KHz sample, it reads the fractional value 201 to determine the relative position of the output sample. For example, the occurrence of the input sample 304 (within the rate manager 202) serves as a trigger for the ASRC 202 to correspondingly produce the output sample 310 and all subsequent output samples, including a final output sample 317, that occur before the next input sample 306 is received. Each of the 16 output samples, 310 through 317, is produced within the timing boundaries of the input samples 304 and 306. And the position of each output sample, for example 310–317, is precisely determined by a corresponding one of the fractional values 201. Stated another way, each of the corresponding fractional values 201 is calculated in order to position the output samples 310–317 relative to the input sample 304.

Although other formats can be used, in the exemplary embodiment of FIG. 2 the fractional value 201 is encoded as an 18 bit signed number ranging from a $-2^{17}$ to $+2^{17}-1$, giving a range of $-2^{17}$ over $2^{18}$ to $(2^{17}-1)/2^{18}$, or $-0.5$ to almost $+0.5$. A value of minus 0.5 means the output sample is aligned with an input sample boundary. A value of 0.0 means the output sample is halfway between input sample boundaries.

In summary, FIG. 3 illustrates an example of how the fractional value 201 controls the correlation between input an output sample timing. In this example of the present invention, the output sample rate of the ASRC 202 of 843.75 KHz is independent of the input sample rate. That is, regardless of whether the selected input sample rate is 48 KHz, 44.1 KHz, or 32 KHz, the sample rate output from the ASRC 202 remains 843.75 KHz.

The underlying idea between the interaction of the rate manager 200 and the ASRC 202 is that although the system clock 212 is a fixed clock, the data running through the digital portion 108 is the same as it would be if the system clock 212 was locked to the input sample rate. As a result, the digital portion 108 can use a free running clock that is inherently low jitter, totally independent from and unrelated to the input sample rate.

Although the rate manager 200 functionally operates off the system clock 212, it outputs pulses locked to the input sample rate. For example, the STC pulses 214 come in at a 27-MhZ rate. Samples 304 and 306, graphically illustrated in FIG. 3, are separated by 562.5 STC pulses in the case of 48-kHz audio. In the exemplary embodiment of FIG. 2, the output sample to the input sample ratio was selected to be 16:1. That is, for the specific input samples illustrated in FIG. 3, for every one input sample, 16 output samples are correspondingly generated. (In reality, however, for the 48-kHz audio, 17 or 18 output samples can be generated for a given input sample.) Thus, once the input sample 304 shown in FIG. 3, is generated, the ASRC 202 then reads the fractional value 201 to determine precisely where the first output sample 310 will occur with reference to the input sample 304.

The fractional value 201 enables the ASRC 202 to know that any given instant in time, how far through the input a given output sample will be. Stated another way, the fractional value 201 conveys how far each output sample is from the last input sample that was generated.

The rate manager 200 has two assessments of the input sample rate. First, it has a theoretical rate based on calculation of the fractional value 201. However, the rate manager 200 also knows the actual input sample rate based on the received STC pulses 214. With this information, the rate manager 200 is able to adjust the calculation of the output samples based on small changes in the input sample by comparing its calculation of where the input sample should be.

For example, as noted earlier the input samples are calculated to occur every 562.5 clock cycles, as indicated with input samples 304 and 306 shown in FIG. 3. However, if the rate manager 200 begins counting, and at the end of 562.5 clock cycles the next input sample is not available, the rate manager 200 will determine that its calculation is too fast or too slow and will make adjustments accordingly. Thus, instead of every 562.5 clock cycles, the rate manager 200 might adjust the calculation to every 562.499 or every 562.501 clock cycles. As these small adjustments occur, so do the corresponding positions of the output samples, illustrated in FIG. 3.

After the ASRC 202 reads a sufficient number of fractional values 201 and correspondingly produces 16 consecutive output samples, as indicated in FIG. 3, the rate manager 200 provides the strobe, alerting the ASRC 202 that its time to get the next input sample 223. The ASRC 202 in turn requests that data forwarded from an up-stream decoder (not shown) be sent at the rate in which that ASRC 202 will output data. This request is transmitted in the form of a PCM request signal 224. This technique of carefully adjusting the output sample rate based upon the input sample rate enables the DAC 104 to run off the single system clock 212 at an arbitrary clock rate that is unrelated to the input sample rate.

Figure 4:
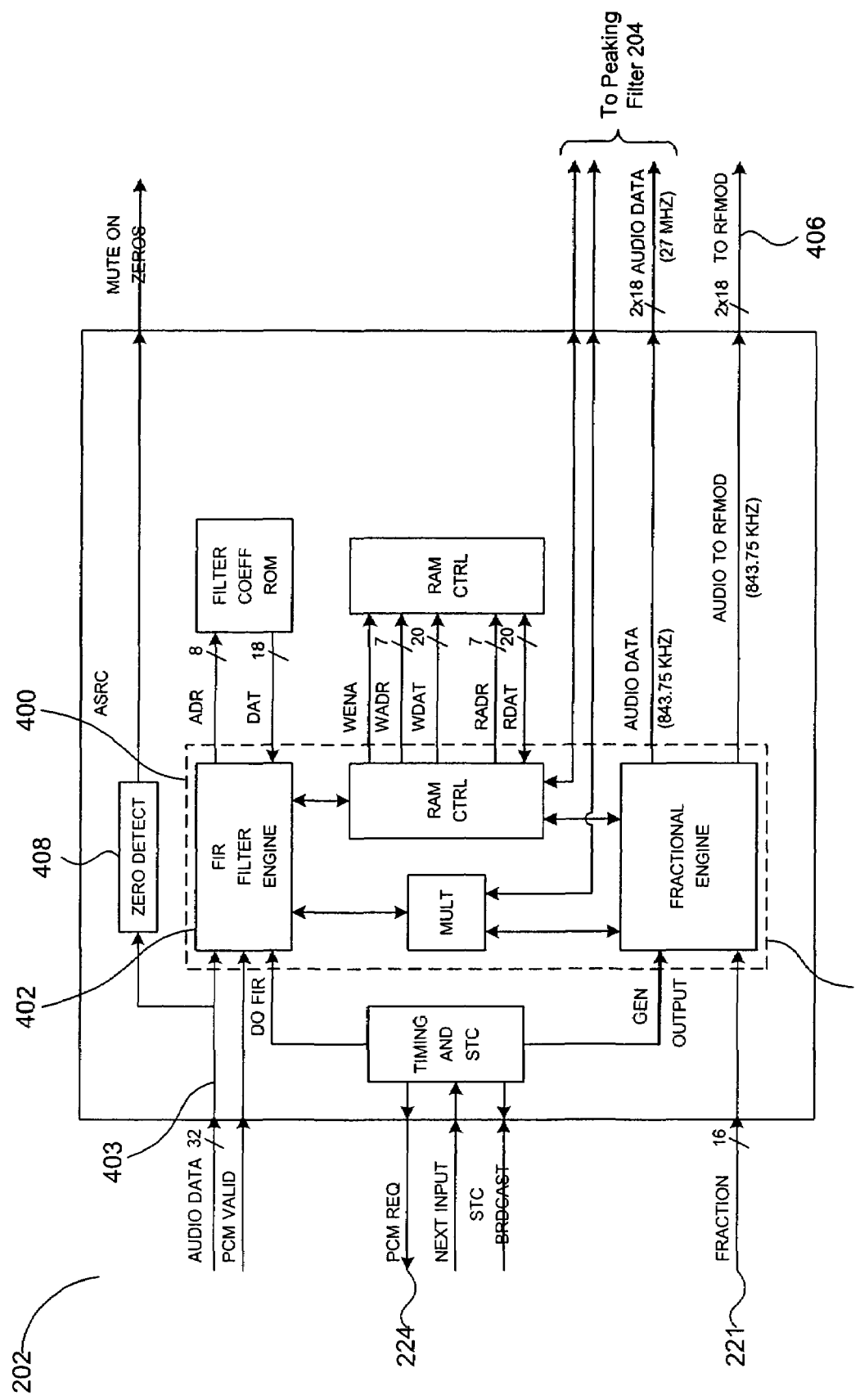
FIG. 4 is a block diagram illustration of an exemplary asynchronous rate converter (ASRC) constructed in accordance with an embodiment of the present invention.

FIG. 4 is an exemplary implementation of the ASRC 202 shown in FIG. 2, constructed in accordance with an embodiment of the present invention. In the example illustrated in FIG. 4, the ASRC 202 converts incoming 48/44.1/32 kHz audio samples to 27 MHz audio samples. The input and output timing need not be locked. The ASRC 202 requests input samples at the 48, 44.1, or 32 kHz rate determined by the rate manager 200. Each time the DAC 104 requests data from upstream, it clocks the current sample into the sample buffer and begins an FIR calculation using, for example, a polyphase low pass filter 400.

As shown in FIG. 4, the polyphase filter 400 includes a finite impulse response (FIR) filter engine 402 configured to receive a PCM audio input 403.

The polyphase filter 400 also includes a fractional engine 404. The fractional engine 404 produces a RF modulator output 406 to hand off to a downstream RF modulator (not shown). The ASCR 202 also includes a zero detection mechanism 408 that is discussed in greater detail below.

Figure 5:
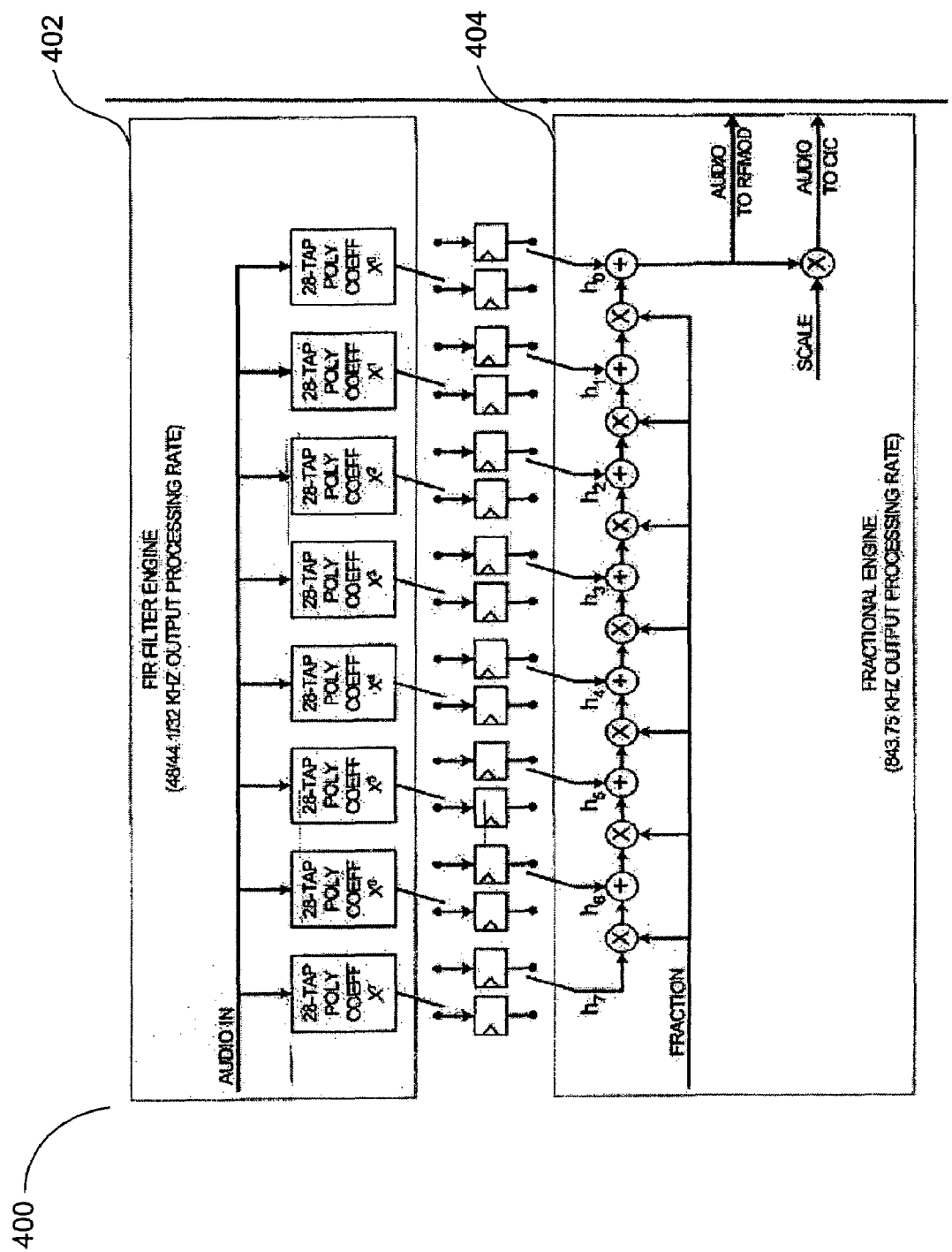
FIG. 5 is a block diagram illustration of an exemplary polyphase filter constructed in accordance with an embodiment of the present invention.

FIG. 5 provides a block diagram 500 of an exemplary implementation of the polyphase filter 400, shown in FIG. 4. In the example of FIG. 5, the FIR filter engine 402 computes the dot product between incoming data samples, which are stored in a random access memory (RAM), and polynomial coefficients associated with the ployphase filter 400. Although any suitable filter design can be used in the present invention, the polynomial coefficients associate with the example of FIG. 5 define the impulse response of a 28-tap, $7^{th}$-order, polyphase low pass filter. This filter has a pass band that is appropriate for 0.453 $F_s$ and a 50 dB stop band, which starts at 0.547 $F_s$. (Fs is 48/44.1/32 kHz.). The output rate of the fractional multiplier engine 404 is about 843.75 kHz. At 843.75 kHz–20 kHz=823.75 kHz, this filter has better than 100 dB of rejection such that aliasing is kept to a minimum.

The structure of the polyphase filter 400, or any other suitable filter structure, allows much of the processing to be done at the input sample rate, with only a few multiply-accumulates at the output rate. Each individual 28-tap filter in the FIR filter engine 402 calculates a new Taylor coefficient each time a new input sample arrives. The total number of multiplies per input sample per channel is 224 (28 times 8).

Coefficients are passed to the fractional engine 404 using ping-pong buffers (not shown) in RAM. This allows the FIR filter engine 402 to take an entire input sample period to calculate new Taylor coefficients while the fractional engine 404 uses the previous coefficients.

The following equation is calculated at a 843.75 kHz output rate to create each output sample at the desirable 843.75 kHz rate discussed above. (In the equation x is a fraction, s is a scale factor, and y is the audio data to be sent to the CIC interpolator 206.)

$$y=s(h_7x^7+h_6x^6+h_5x^5+h_4x^4+h_3x^3+h_2x^2+h_1x^1+h_0)$$

In order to avoid raising values to a power directly, the fractional engine 404 evaluates the equivalent function:

$$Y=s((((((h_7+h_6)x+h_5)x+h_4)x+h_3)x+h_2)x+h_1)x+h_0)$$

This requires eight multiplies for each output sample-double that is required to calculate left and right values. The sample buffer (not shown) can be put in test tone mode and written by software for testing purposes.

Samples from the fractional engine 404 can be scaled before going to an RF modulator output 406, the peaking filter 204, and the CIC 206. This is meant to normalize gain through the polyphase filter 400. Scaling is a factor from 0 to 1, inclusive. Therefore, there is only attenuation, that should not exceed unity gain in the scaler.

When software changes the scale target, a counter will linearly ramp the actual scale factor from the current value to the new target value. The slope of the ramp is controlled by a register. The slowest ramp can take as long as 4.8 seconds to go from no attenuation to mute. The fastest ramp takes about one 843.75-kHz period.

The ASRC 202 uses a shared parallel multiplier to perform all multiplies in the FIR filter engine 402 and the fractional engine 404. The fractional engine 404 does 16 multiplies every 843.75 kHz for a stereo pair, plus 16 multiplies for the peaking filter 204, or 27 million multiplies per second total. The FIR filter engine 402 does 448 multiplies every input sample time, or 22 million multiplies per second total for 48 kHz.

The multiplier is timeshared, on a clock-by-clock basis, between the FIR engine 402 and the fractional engine 404. Each function gets access every other clock. Access to the RAM is also shared between the FIR filter engine 402 and the fractional engine 404. This means the minimum system clock frequency must be more than twice the fractional multiply rate or twice the FIR multiply rate, whichever is greater. For input sample rates 48 kHz and below, the fractional engine limits the clock rate to 54 MHz or higher. For input sample rates 96 kHz and above, the FIR engine 402 limits the clock rate to at least 448 times the sample rate.

Figure 6:
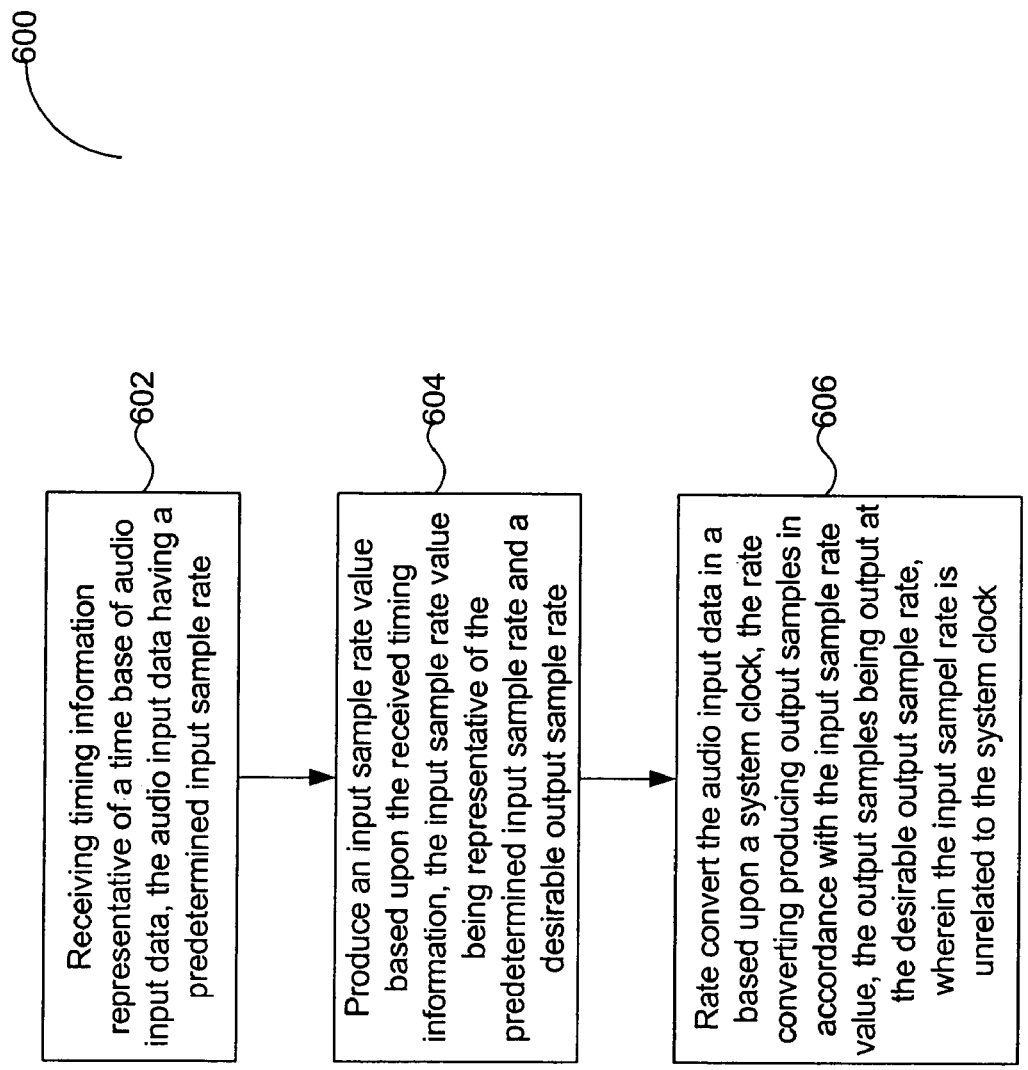
FIG. 6 is a flowchart of an exemplary method of practicing an embodiment of the present invention.

FIG. 6 is an example process flowchart 600 that illustrates a method of practicing the present invention. The example process flowchart begins at step 602, which includes receiving timing information representative of a time base of audio input data at a predetermined input sample rate. An input sample rate value is produced based upon the received timing information. The input sample rate value is representative of the predetermined input sample rate and a desirable output sample rate is indicated in step 604.

Step 606 includes rate converting the audio input data based upon a system clock. The rate converting produces output samples in accordance with the input sample rate value, wherein the output samples are output at the desirable output sample rate. In the present invention, the input sample rate is unrelated to the system clock 212.

Referring back to FIG. 4, after the RF modulator output 406 is latched, but prior to the peaking filter 204, another scaling block is used as a volume control. This allows the volume to the DAC 104 to be controlled without affecting the RF modulator out data 406. It is substantially identical to the scaling function mentioned above. When the volume control scale factor gets to zero, the mapper 210 can be told to mute the DACp/DACn outputs with a square wave or constant low value.

The ASRC 202 checks the PCM input 403 for zeros using a PCM zero detect module 408. If the zero detect module 408 detects a programmable number of zero samples in a row, it signals the digital modulator 209 to auto-mute its input. As soon as a non-zero PCM input value is detected, auto-mute will be de-asserted. By way of background, muting improves signal-to-noise measurements because the modulator 209 will not send constant zeros to the mapper 210 even when the PCM data is zero. However, muting causes the mapper 210 to output a square wave or constant low. The auto-mute can be enabled or disabled by software.

There is a pipeline delay through the ASRC 202, modulator 209, and the mapper 210. Since the detection is at the PCM input 403 to the FIR engine 402, and the mute occurs in the mapper 210. The mapper 210 mutes after dithered/modulated zeros have been output for some time. The mapper 210 un-mutes while zeros are still passing through the ASRC 202 and the modulator 209. Therefore, only zero PCM values will be auto-muted.

Figure 7:
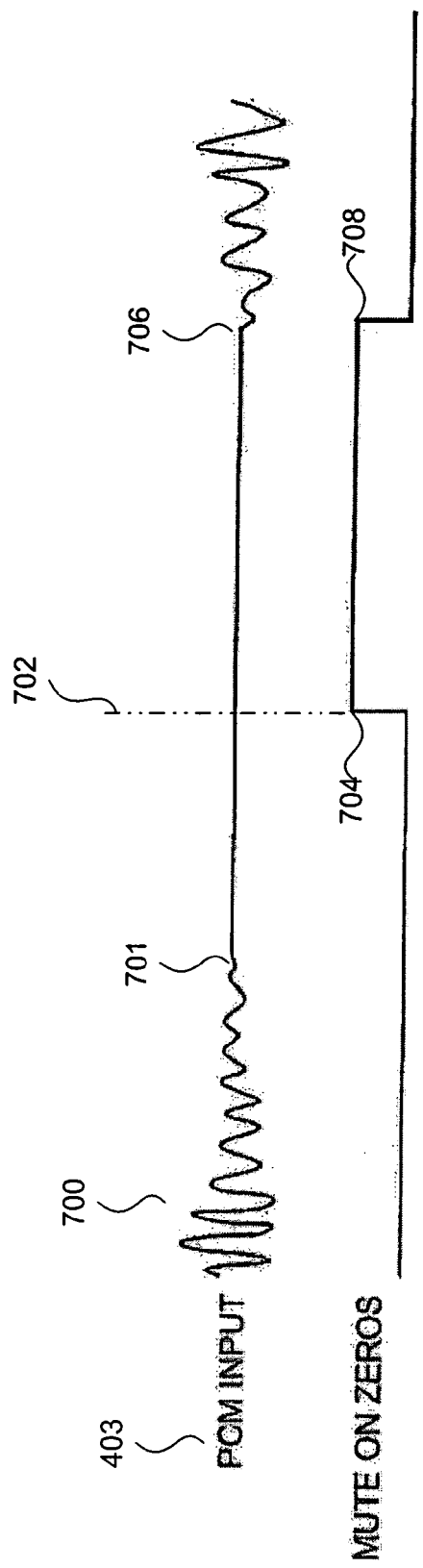
FIG. 7 is an illustration of an auto muting technique used in accordance with an embodiment of the present invention.
Figure 8:
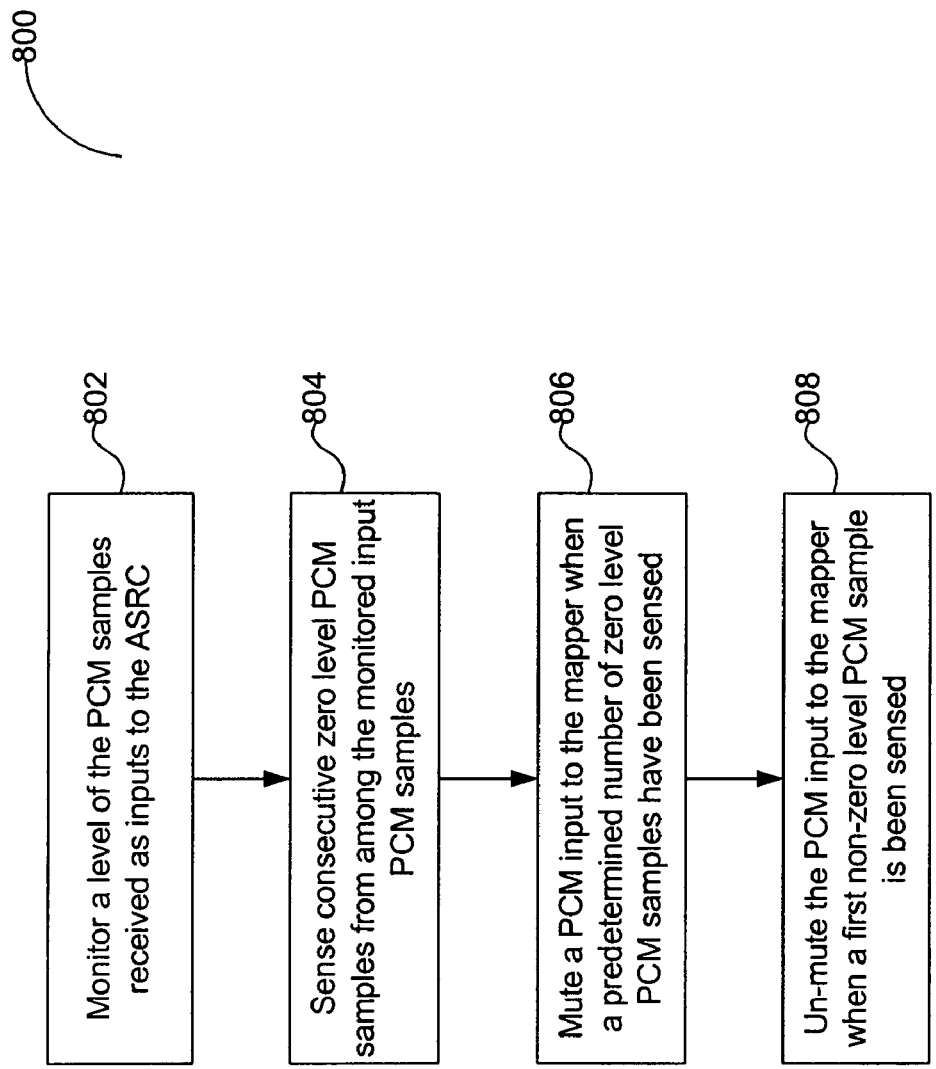
FIG. 8 is a flowchart of an exemplary method of practicing the technique shown in FIG. 7.

FIG. 7 is a more detailed illustration of an exemplary technique of implementing the auto-mute function in accordance with the present invention. FIG. 8 is another process flow chart 800 of implementing the auto-mute function illustrated in FIG. 7. Auto-muting, as implemented herein, improves what is measured on the system output as noise. This is accomplished by stripping zero level data of any potential modulation noise. Referring to FIG. 2, modulation noise can occur at the output to the mapper 210 when zero level data is processed within the modulator 209.

Although other modulation schemes can be used, the output of the modulator 209 is pulse width modulated. That is, non-zero level data appears at the output as a wide pulse data sample, and zero level data is intended to appear as a narrow square-wave pulse. The problem is that zero-level input data samples, received at the input to the modulator 209, do not always neatly appear as corresponding narrow square-wave pulses at the output of the mapper 210. This occurs because the zero-level data is actually modulated within the modulator 209, and subsequently can appear as "modulation noise" at the output. Muting the input to the mapper 210, however, produces cleaner narrow square-wave pulses at the output of the mapper 210.

In FIG. 7, the zero detect module 408 monitors the input 403 of the ASRC 202, as described in step 802 of FIG. 8. The monitoring determines when non-zero level input data 700 (within the data 403) transitions to zero level input data. A valid presence of zero level data is represented by the start of a string of consecutive zero level input data samples 701, as shown in FIG. 7 and described in step 804 of FIG. 8. After the occurrence of a predetermined number of consecutive zeros 702, the audio out to the mapper 210 is muted 704 (step 806 of FIG. 8). The exact number of consecutive zeros that occur before muting is implemented is a programmable value.

When the muting 704 occurs, a cleaner signal is produced at the output of the analog processing portion 110 than would otherwise be produced without muting. Without muting, zero level data will propagate through the system, is then modulated within the modulator 209, and can be sensed as modulation noise at the output of the modulator 209. Muting, however, greatly reduces the occurrence of such modulation noise. When an end 706 of the consecutive zero level samples is sensed by the zero detect module 408, the input to the mapper 210 is un-muted. As indicated in step 808 of FIG. 8, un-muting occurs when the first non-zero level data sample is sensed following the occurrence of the string of zero level samples.

Referring back to FIG. 2, an output of the ASRC 202 is provided to the peaking filter 204. The peaking filter 204 is a low pass filter provided to compensate for droop on the external low pass filter as audio frequencies approach 20 KHz. The peaking filter 204 can be software enabled and can be of any suitable low pass filtered design. In the exemplary embodiment of FIG. 2, for example, the peaking filter 204 is a two pole recursive filter with programmable 18 bit coefficients to allow for different external filter designs with different pass band characteristics.

In an associated external filter, discussed below with regard to FIG. 13, a gain across the filter's pass band begins to "drop down" as it approaches about 20 KHz. This dropping down, or droop, can be on the order of about 3 dB. The peaking filter 204 provides about a 3 dB peak to compensate for this droop at about the 20 KHz region. The output of the peaking filter 204 is provided to the CIC filter 206.

Figure 9:
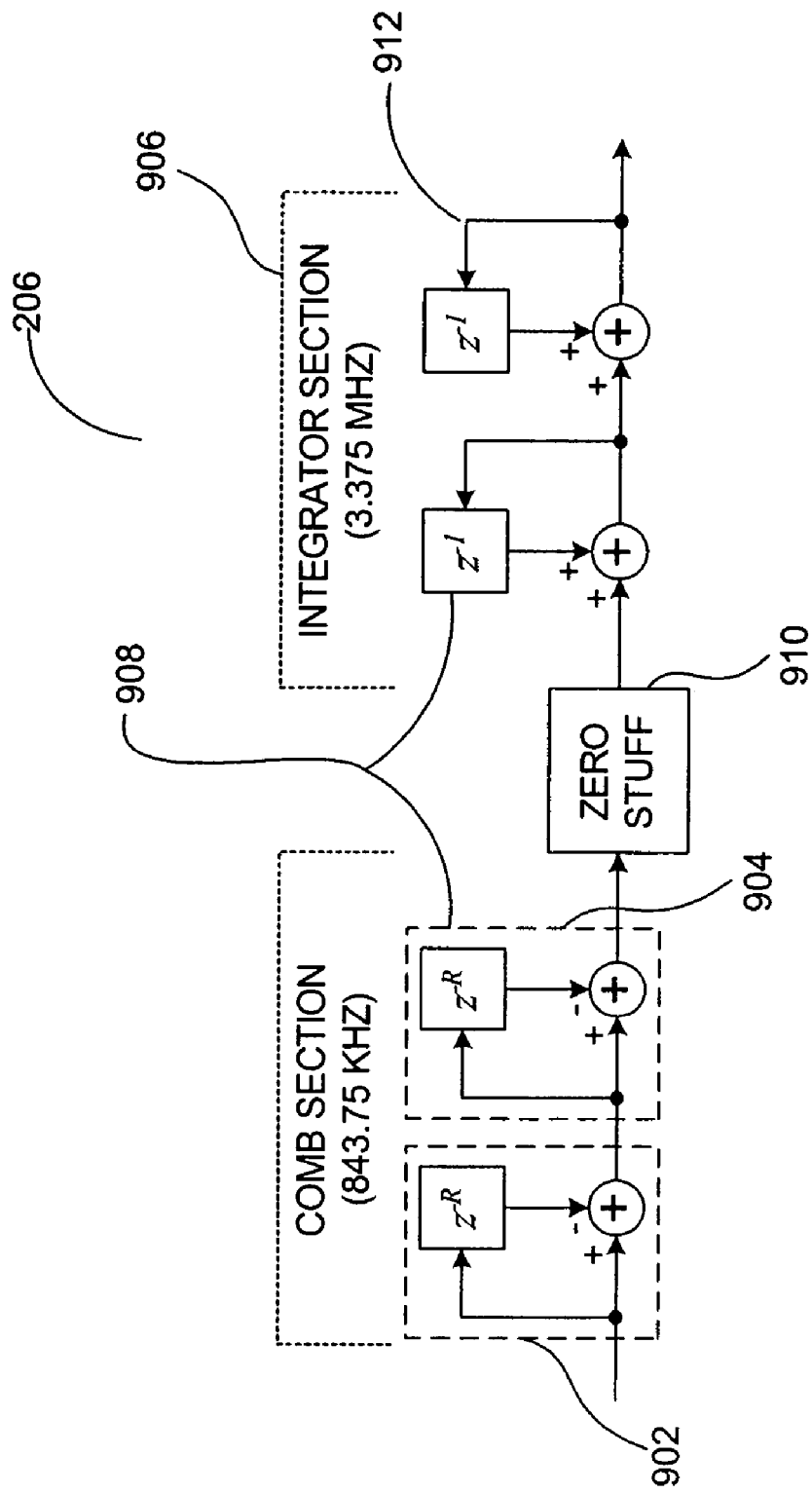
FIG. 9 is a block diagram illustration of an exemplary cascaded integrator-comb (CIC) filter constructed in accordance with an embodiment of the present invention.

FIG. 9 is block diagram illustration of an exemplary $2^{nd}$ order implementation of the CIC interpolator 206, shown in FIG. 2. In FIG. 9, the CIC interpolator 206 synchronously converts the 843.75 kHz samples to 3.375 MHz, a sample rate increase of 4×. This requires very little hardware and is appropriate for such over-sampled audio data.

Each comb, for example combs 902 and 904, calculates a new output, which is the difference between the current and previous 843.75-kHz sample, every 843.75-kHz period. An integrator 906 adds a new value every 3.375-MHz period. A middle comb/integrator pair 908 with a zero stuffer 910 between is equivalent to a 0-order hold, or sample and hold (i.e., a bank of flip flops updated every 843.75 kHz). That is, the output of the first comb 902 can feed the input of a final integrator 912 directly as long as the comb holds its output constant for 32 27-MHz periods.

The entire CIC 206 can be bypassed, giving the effect of a first order CIC, which, as noted above, is the same as a 0-order hold. If a $1^{st}$-order CIC is sufficient, the CIC 206 could be removed entirely in a future design for some area reduction.

Figure 10:
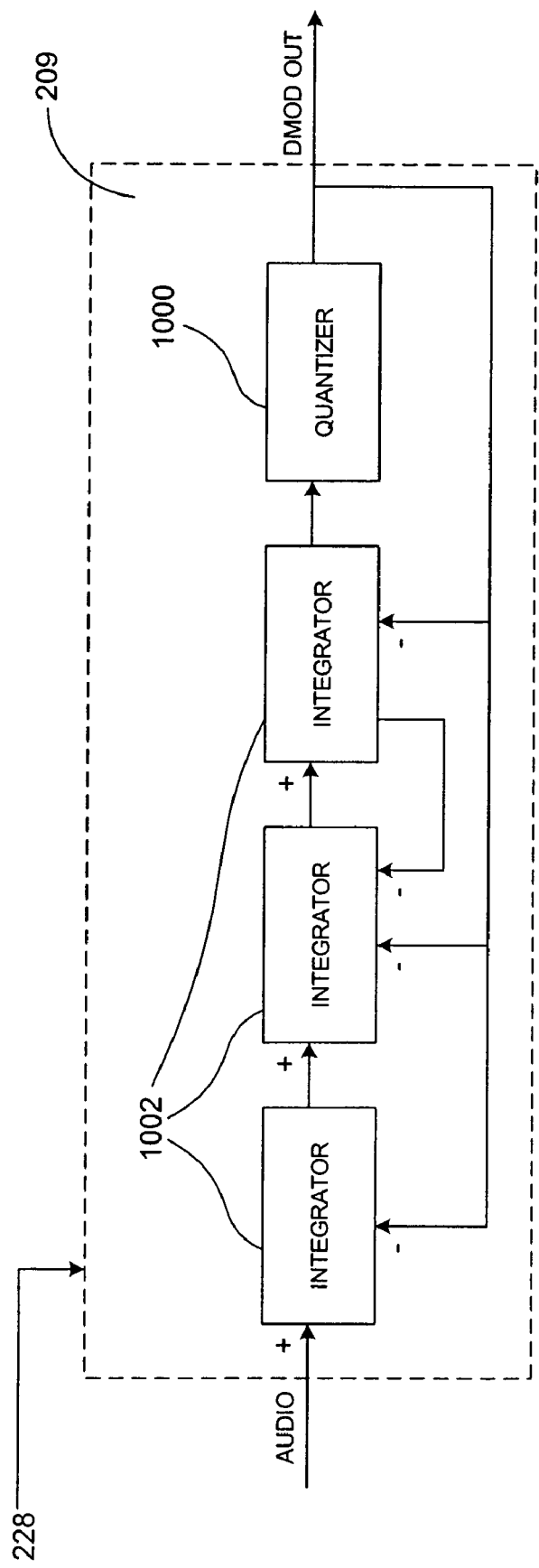
FIG. 10 is a block diagram illustration of an exemplary digital modulator constructed in accordance with an embodiment of the present invention.

FIG. 10 is a block diagram of an exemplary implementation of the digital modulator 209, shown in FIG. 2. In FIG. 10, the digital modulator 209 converts the 3.375-MHz 20-bit audio samples to an 8-bit value to be serially output one bit every 27-MHz period. The digital modulator 209 uses sigma-delta modulation to spread the quantization noise across the frequency spectrum and shape it such that little noise is added to the signal band, while more noise is added to higher frequencies, which is filtered by the external low pass filter. In the example of FIG. 10, the modulator 209 is a $3^{rd}$-order modulator. A quantizer 1000 includes programmable dither logic, allowing software selection of the dither level. Integrators 1002 use the feedback of the quantized, mapped signal to shape the noise to be out of band.

Figure 11:
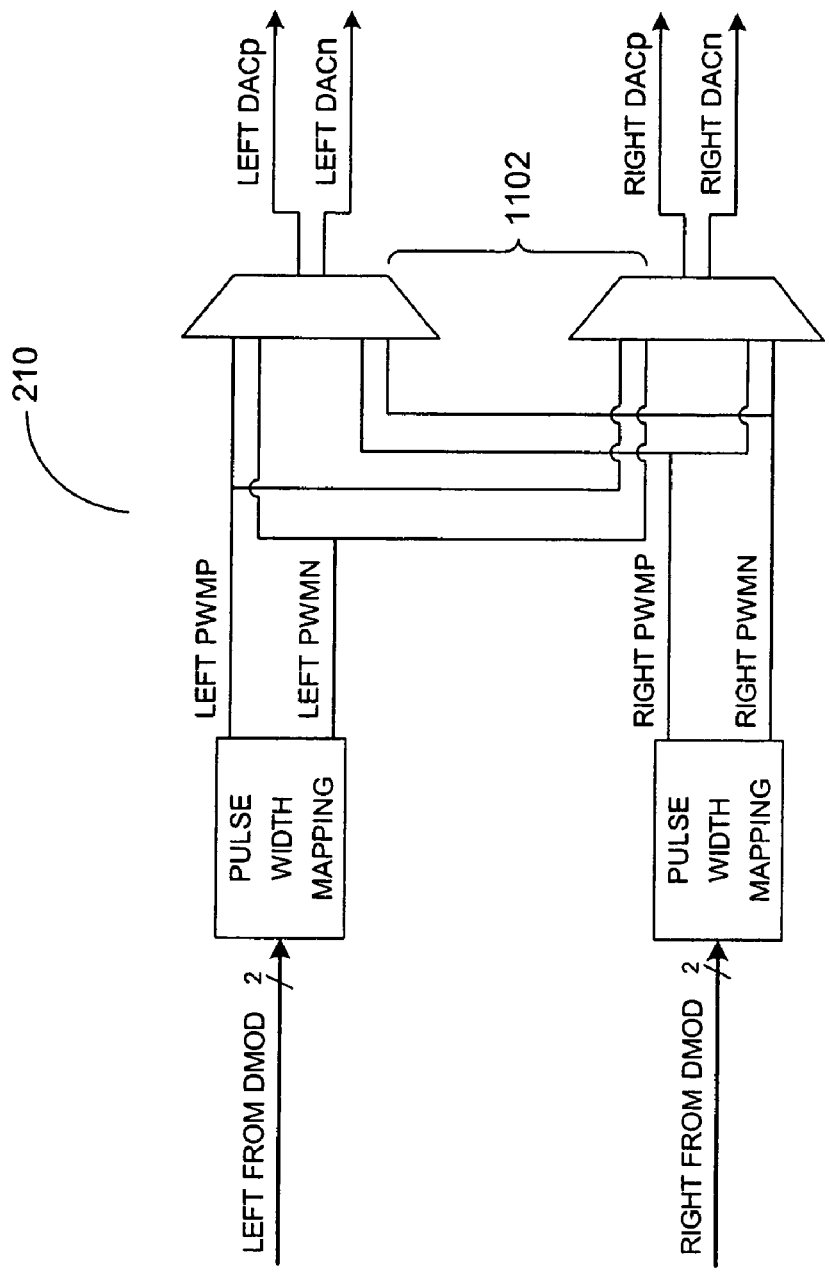
FIG. 11 is a block diagram illustration of an exemplary mapper constructed in accordance with an embodiment of the present invention.

FIG. 11 provides a block diagram overview of an exemplary implementation of the mapper 210, illustrated in FIG. 2. The mapper 210 is able to select which channel from the digital modulator 209 goes out which DACp/DACn pair. This allows a different left/right selection than that going to the RF modulator. Independent muxes 1102 allow normal, swapped, or identical left/right output. If, for example, the RF modulator needed mono on the left channel and SAP on right, the muxes 1102 can be set so that left DAC output and the right DAC output both play mono or both play SAP.

Figure 12:
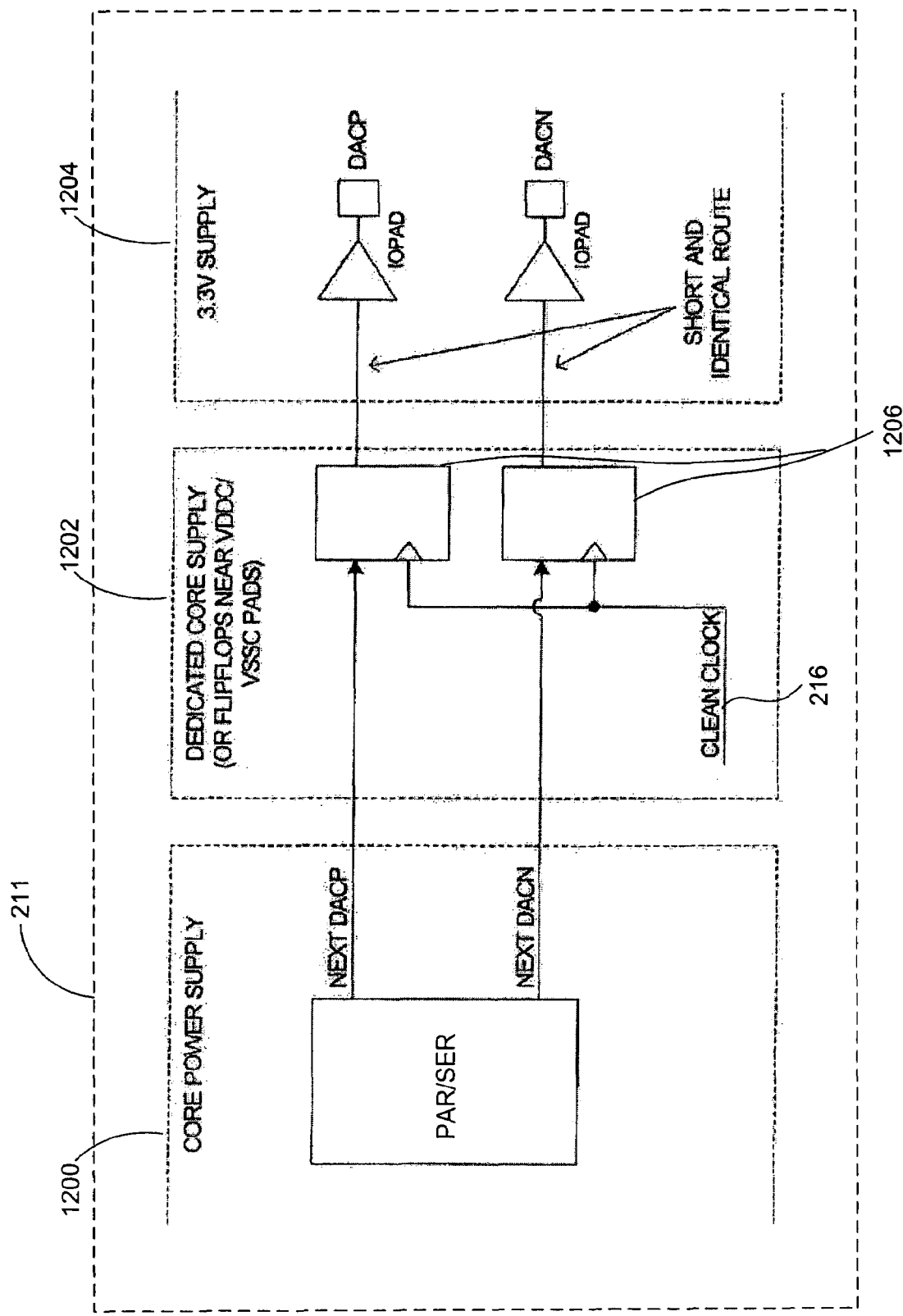
FIG. 12 is a block diagram illustration of an exemplary parallel to serial converter used in an embodiment of the present invention.

FIG. 12 is an exemplary illustration of the path from the mapper 210 to the parallel to serial converter 211 (the final output stage) and ultimately to the pins of the digital processing portion chip 108. The final output stage 211 is preferably clocked by a clean clock signal, such as the 27 MHz signal 216.

More particularly, the exemplary final output stage 211 of FIG. 12 includes a core power supply 1200, a dedicated core supply 1202, and a 3.3V supply 1204. As shown, the dedicated core supply 1202 includes flip-flops 1206. It is desirable that this final stage 211 be clocked by the separate clock 216 to achieve optimal performance. Optimal performance is achieved in the final output stage 211 using a separate and clean low jitter clock, and clean power supplies, to minimize analog signal noise. As a minimum, it is desirable that the flip-flops 1206 be clocked by the separate clean clock signal 216 since these devices are near the pads, where the parallel to serial conversion is occurring.

Figure 13:
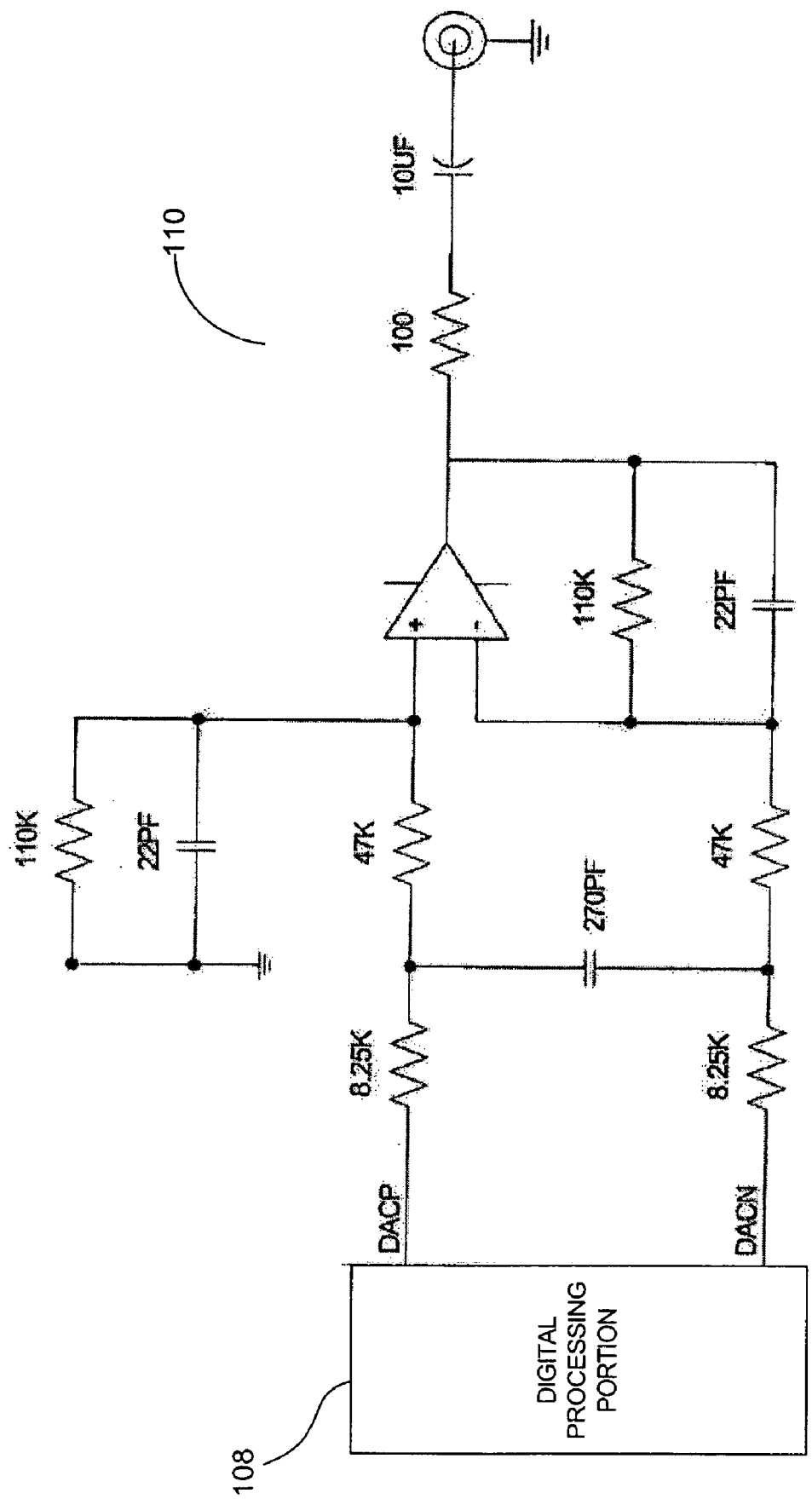
FIG. 13 is a schematic diagram of an exemplary external filter used as the analog portion of embodiment of the present invention shown in FIG. 1.

FIG. 13 is an exemplary schematic diagram illustration of the analog processing portion 110. In FIG. 13, the DACp and DACn signals from the digital processing portion chip 108 pass through some external circuitry to create the analog audio output of the DAC 104. The analog processing portion 110 is essentially an additional low-pass filter, discussed above, provided to achieve the final stage of the conversion to analog and remove any quantization noise that has been shaped by the digital modulator 209 to be out of band.

CONCLUSION

The present invention reduces the number of clocks required for a single DAC to accommodate multiple data streams. This feature is supported by provided a single free running clock that operates independent of the input sample rate. Since the requirement of multiple system clock to accommodate multiple data streams is eliminated, the digital processing portion 108 can be formed on a single IC, thus providing significant savings in terms of the cost and chip real estate.

The present invention has been described above with the aid of functional building blocks illustrating the performance of specified functions and relationships thereof. The boundaries of these functional building blocks have been arbitrarily defined herein for the convenience of the description. Alternate boundaries can be defined so long as the specified functions and relationships thereof are appropriately performed.

Any such alternate boundaries are thus within the scope and spirit of the claimed invention. One skilled in the art will recognize that these functional building blocks can be implemented by analog and/or digital circuits, discrete components, application-specific integrated circuits, firmware, processor executing appropriate software, and the like, or any combination thereof. Thus, the breadth and scope of the present invention should not be limited by any of the above-described exemplary embodiments, but should be defined only in accordance with the following claims and their equivalents.

The foregoing description of the specific embodiments will so fully reveal the general nature of the invention that others can, by applying knowledge within the skill of the art (including the contents of the references cited herein), readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance presented herein, in combination with the knowledge of one of ordinary skill in the art.

What we claim is:

1. A digital to analog converter (DAC) configured to convert input digital data having a predetermined input sample rate to analog data, comprising:

a digital portion configured to (i) receive the digital data and timing information representative of a time base of the input sample rate and (ii) digitally process the digital data and the system timing data to produce serialized output data; and an analog portion configured to convert the serialized data to an analog format;

wherein the digital portion operates in accordance with at least one system clock having a corresponding system clock rate independent of the input sample rate.

2. The DAC of claim 1, wherein the digital portion includes a rate manager and a rate converter.

3. The DAC of claim 2, wherein the rate converter is asynchronous.

4. The DAC of claim 2, wherein the rate manager receives the input sample rate data in accordance with the clock and produces an input sample rate value therefrom.

5. The DAC of claim 4, wherein the value correlates the input sample rate with a desired output sample rate.

6. The DAC of claim 5, wherein the value is a fractional value having ranges from −217 to 217.

7. A method for converting digital data having a predetermined input sample rate to analog samples in a digital to analog converter (DAC), the method comprising:

receiving timing information representative of a time base of input data having a predetermined input sample rate;

producing an input sample rate value based upon the received timing information, the input sample rate value being representative of the predetermined input sample rate and a desirable output sample rate; and rate converting the input data based upon a system clock to produce output samples at in accordance with the input sample rate value, the output samples being output at the desirable output sample rate;

wherein the input sample rate is independent of the system clock.

8. The method of claim 7, wherein the rate converting is asynchronous.

9. The method of claim 8, wherein the input sample rate value is a fractional value having ranges from −217 to 217.

10. The method of claim 9, wherein the fractional value is computed each period of the system clock.

* * * * *